(12) United States Patent
Adachi et al.

(10) Patent No.: US 9,240,502 B2
(45) Date of Patent: *Jan. 19, 2016

(54) ELEMENT AND PHOTOVOLTAIC CELL

(75) Inventors: Shuichiro Adachi, Tsukuba (JP);
Masato Yoshida, Tsukuba (JP); Takeshi Nojiri, Tsukuba (JP); Yoshiaki Kurihara, Tsukuba (JP); Takahiko Kato, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 130 days.

This patent is subject to a terminal disclaimer.

(21) Appl. No.: 13/556,702

(22) Filed: Jul. 24, 2012

(65) Prior Publication Data

US 2013/0025668 A1    Jan. 31, 2013

Related U.S. Application Data

(60) Provisional application No. 61/511,199, filed on Jul. 25, 2011.

(30) Foreign Application Priority Data

Jul. 25, 2011    (JP) .................................. 2011-162599

(51) Int. Cl.
*H01B 1/02* (2006.01)
*H01B 1/22* (2006.01)
*H01L 31/0224* (2006.01)

(52) U.S. Cl.
CPC .......... *H01L 31/022458* (2013.01); *H01B 1/22* (2013.01); *H01L 31/022425* (2013.01); *Y02E 10/50* (2013.01)

(58) Field of Classification Search
CPC ........................ H01B 1/22; H01L 31/022425
USPC .................. 252/512, 514; 136/256, 261, 265; 429/188
See application file for complete search history.

(56) References Cited

U.S. PATENT DOCUMENTS

2008/0199772 A1* 8/2008 Amatucci et al. ............. 429/188
2010/0096014 A1* 4/2010 Iida et al. ...................... 136/265

(Continued)

FOREIGN PATENT DOCUMENTS

JP          62-296559    * 12/1987    ............. H01L 29/46
JP          2001-110232 A    4/2001

(Continued)

OTHER PUBLICATIONS

L. N. Ho, "Electrical Properties of Pre-Alloyed Cu—P Containing Electrically Conductive Adhesive", The Journal of Adhesion, vol. 86, No. 8, 2010, pp. 807-815.

(Continued)

*Primary Examiner* — Khanh Tuan Nguyen
(74) *Attorney, Agent, or Firm* — Fitch, Even, Tabin and Flannery LLP

(57) ABSTRACT

The invention provides an element including a semiconductor substrate and an electrode disposed on the semiconductor substrate, the electrode being a sintered product of a composition for an electrode that includes phosphorus-containing copper alloy particles, glass particles and a dispersing medium, and the electrode includes a line-shaped electrode having an aspect ratio, which is defined as electrode short length:electrode height, of from 2:1 to 250:1.

15 Claims, 2 Drawing Sheets

(56) References Cited

U.S. PATENT DOCUMENTS

2011/0277831 A1* 11/2011 Yoshida et al. ............... 136/256
2012/0067415 A1* 3/2012 Tachizono et al. ............ 136/256

FOREIGN PATENT DOCUMENTS

| JP | 2005-222737 | A | 8/2005 | | |
| JP | 2006-313744 | A | 11/2006 | | |
| JP | 2007-019106 | A | 1/2007 | | |
| JP | 2008-034592 | A | 2/2008 | | |
| JP | 2008-226816 | A | 9/2008 | | |
| JP | 2010-013730 | * | 1/2010 | ............... | B22F 1/00 |
| JP | 2010-013730 | A | 1/2010 | | |
| JP | 2010-059469 | A | 3/2010 | | |
| TW | 201105600 | A1 | 2/2011 | | |
| WO | WO 2008/078374 | A1 | 7/2008 | | |
| WO | WO 2010-109905 | A1 * | 9/2010 | ............... | C03C 8/04 |
| WO | WO 2011-046176 | A1 | 4/2011 | | |
| WO | WO 2011-090211 | A1 | 7/2011 | | |
| WO | WO 2011-090214 | A1 | 7/2011 | | |
| WO | WO 2011-090215 | A1 | 7/2011 | | |

OTHER PUBLICATIONS

Office Action issued Jul. 22, 2014, in Japanese Patent Application No. 2013-525682.

Office action of TW Appln. No. 101126499 dated Oct. 16, 2014 with partial English translation.

* cited by examiner

ELEMENT AND PHOTOVOLTAIC CELL

CROSS-REFERENCE TO RELATED APPLICATION

This application claims priority under 35 USC 119(e) from U.S. Provisional Application No. 61/511,199, the disclosure of which is incorporated by reference herein.

BACKGROUND OF THE INVENTION

1. Field of the Invention

The present invention relates to an element and a photovoltaic cell.

2. Background of the Invention

Generally, a surface electrode is provided on a silicon photovoltaic cell. The wiring resistance or the contact resistance of the surface electrode relates to a voltage loss that is relevant to conversion efficiency. In addition, the width or the shape of the surface electrode affects the amount of incident sunlight.

The surface electrode of a photovoltaic cell is typically formed in the following manner. Specifically, a conductive composition is applied onto an n-type semiconductor layer that is formed by thermally diffusing phosphorus or the like into the light-receiving side of a p-type semiconductor substrate at high temperature, and a surface electrode is formed by sintering the applied conductive composition at from 800° C. to 900° C. The conductive composition for forming the surface electrode includes a conductive metal powder, glass particles, additives of various kinds and the like.

As the conductive metal powder, a silver powder is generally used. However, use of a powder of metal other than silver has been considered for various reasons. For example, a conductive composition that can form an electrode for a photovoltaic cell that includes silver and aluminum has been disclosed (see, for example, Japanese Patent Application Laid-Open (JP-A) No. 2006-313744).

Further, a composition for forming an electrode that includes metal nanoparticles that include silver and particles of metal other than silver has been disclosed (see, for example, JP-A No. 2008-226816).

Silver, which is typically used for forming an electrode, is a noble metal whose resource is limited and the price of a bare metal is high. Therefore, proposal of alternative materials for a silver-containing conductive composition (silver-containing paste) has been expected. Copper, which is used for semiconductor wiring materials, is a prospective material that will replace silver. Copper is abundant in supply and the price of a bare metal is about a hundredth of the price of silver.

However, copper is easily oxidized at high temperature of 200° C. or more. Accordingly, for example, in a case of forming an electrode from the composition described in JP-A 2006-313744 that includes copper as a conductive metal, a special process of sintering the composition in an atmosphere of nitrogen or the like is required.

The present invention aims to provide an element having an electrode in which oxidation of copper during sintering is suppressed and the resistivity is lowered, and a photovoltaic cell having the element.

Means for Solving the Problems

The following are specific embodiments for solving the problems.

<1> An element comprising a semiconductor substrate and an electrode disposed on the semiconductor substrate, the electrode being a sintered product of a composition for an electrode that comprises phosphorus-containing copper alloy particles, glass particles and a dispersing medium, and the electrode comprising a line-shaped electrode having an aspect ratio, which is defined as electrode short length:electrode height, of from 2:1 to 250:1.

<2> The element according to <1>, wherein the content of phosphorus in the phosphorus-containing copper alloy particles is from 6 mass % to 8 mass %.

<3> The element according to <1>, wherein the glass particles have a glass softening point of 600° C. or less and a crystallization onset temperature of more than 600° C.

<4> The element according to <1>, wherein the composition for an electrode further comprises silver particles.

<5> The element according to <4>, wherein the content of the silver particles is from 5 mass % to 65 mass % when the total content of the phosphorous-containing copper alloy particles and the silver particles is 100 mass %.

<6> The element according to <4>, wherein the total content of the phosphorus-containing copper alloy particles and the silver particles in the composition for an electrode is from 70 mass % to 94 mass %, the content of the glass particles in the composition for an electrode is from 0.1 mass % to 10 mass %, and the content of the dispersing medium in the composition for an electrode is from 3 mass % to 29.9 mass %.

<7> The element according to <1>, wherein the semiconductor substrate comprises an impurity diffusion layer and the electrode is disposed on the impurity diffusion layer, and wherein the element is used in a photovoltaic cell.

<8> A photovoltaic cell comprising the element used in a photovoltaic cell according to <7>, and a tab line disposed on the electrode of the element.

Effect of the Invention

According to the invention, it is possible to provide an element having an electrode in which oxidation of copper during sintering is suppressed and the resistivity is lowered, and a photovoltaic cell having the element.

EMBODIMENTS FOR IMPLEMENTING THE INVENTION

In the present specification, a numerical range expressed by "A to B" refers to a range that includes A and B as the minimum value and the maximum value, respectively.

The term "process" refers not only to an independent process but also to a process that cannot be clearly distinguished from another process, insofar as the purpose of the process is achieved.

With regard to the amount of components of a composition, when plural substances corresponding to the same component exist in the composition, the amount of the component refers to the total amount of the plural substances, unless otherwise specified.

<Element>

The element of the invention includes a semiconductor substrate and an electrode positioned on the semiconductor substrate. The electrode is a sintered product of a composition for an electrode that includes phosphorus-containing copper alloy particles, glass particles and a dispersing medium, and includes a line-shaped electrode having an aspect ratio, which is defined as electrode short length:electrode height, of from 2:1 to 250:1.

By forming an electrode by using phosphorus-containing copper alloy particles, oxidation resistivity of copper is increased. It is considered that phosphorus included in copper-containing particles functions as a reducing agent with respect to a copper oxide. As a result, it is presumed that oxidation of copper is suppressed and an electrode having a low resistivity can be formed.

Further, by including a line-shaped electrode having an aspect ratio of from 2:1 to 250:1, the resistivity of the electrode formed from the phosphorus-containing copper alloy particles can be further lowered and adhesiveness of the electrode with respect to a substrate can be improved.

Figure 1:
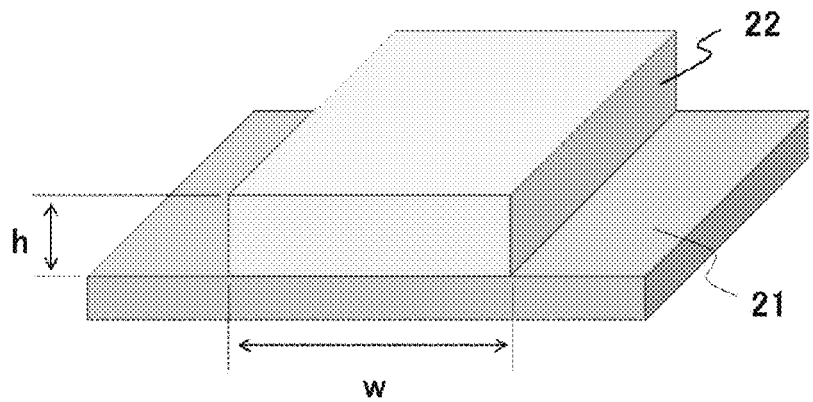
FIG. 1 is an oblique perspective view including a section of an element according to the invention.

The aspect ratio is defined as described below. As shown in FIG. 1, the aspect ratio is a ratio (w:h) of the short length (w) to the height (h) of electrode 22 formed on substrate 21. The short length (w) of electrode 22 refers to a length of the short length (width) of electrode 22 at a portion at which electrode 22 contacts substrate 21. The height of electrode 22 refers to a height of electrode 22 from substrate 21 (thickness).

Figure 3:
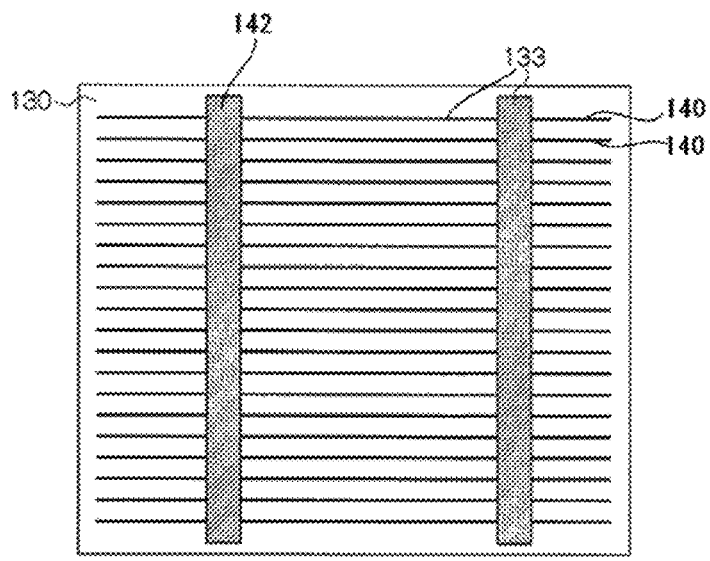
FIG. 3 is a plan view of a light-receiving surface side of a photovoltaic cell element of an embodiment of the invention.

The "line-shaped electrode" refers to an electrode having an elongated shape having a long length direction and a short length direction in a plan view of substrate 21 (i.e., the shape of the electrode observed from a thickness direction of the substrate, as shown in FIG. 3, for example). The line-shaped electrode may be straight or curved in a plan view. The section of the electrode cut in a thickness direction of substrate 21, as shown in FIG. 1, may have any shape such as a rectangle, a semicircle or a triangle. When the section of electrode 22 has a rectangular shape, the shape of the section may be any of square, oblong, trapezoidal or the like. The height (h) of electrode 22 refers to a distance from substrate 21 to a portion at which the section of electrode 22 is highest.

The aspect ratio can be, for example, calculated with a stylus surface profilometer. When a film (for example, an antireflection film) is formed on substrate 21, the thickness of the film is added to the height (h) of electrode 22.

The aspect ratio is an average value of the short length and the height of an electrode measured at 10 positions.

The aspect ratio is from 2:1 to 250:1, preferably from 2.5:1 to 230:1, more preferably from 3:1 to 200:1, further preferably from 3:1 to 180:1, yet further preferably from 3:1 to 150:1. When the height of the electrode is higher than a height that satisfies an aspect ratio of 2:1, adhesion of the electrode with respect to a substrate tends to be insufficient. When the height of the electrode is lower than a height that satisfies an aspect ratio of 250:1, the thickness of the electrode may be insufficient for the shape of the texture formed on a substrate during the production of a photovoltaic cell, which will be described later, and the resistivity of the electrode tends not to be lowered.

The proportion of an area of the electrode having an aspect ratio of from 2:1 to 250:1 with respect to the total area of the electrode, when observed from a thickness direction of the substrate, is preferably from 90% to 100%, more preferably from 92% to 100%, further preferably from 95% to 100%. When the proportion is from 90% to 100%, the effect of the invention is attained more effectively.

The length of the short length of the electrode having an aspect ratio of from 2:1 to 250:1 is preferably from 30 μm to 2000 μm, more preferably from 50 μm to 1800 μm, further preferably from 50 μm to 1600 μm. When the length is from 30 μm to 2000 μm, the effect of the invention is attained more effectively. The short length as described above is an average value of the lengths measured at 10 positions of an electrode.

(Phosphorus-Containing Copper Alloy Particles)

The composition for an electrode includes at least one kind of phosphorus-containing copper alloy particles, at least one kind of glass particles and at least one kind of dispersing medium. By this composition, oxidation of copper during sintering can be suppressed and an electrode having a low resistivity can be formed.

The composition for an electrode includes at least one kind of phosphorus-containing copper alloy particles.

From the viewpoints of oxidation resistance and low resistivity, the content of phosphorus in the phosphorus-containing copper alloy is preferably from 6 mass % or more to 8 mass % or less, more preferably from 6.3 mass % or more to 7.8 mass % or less, and further preferably from 6.5 mass % or more to 7.5 mass % or less. If the phosphorus content in a phosphorus-containing copper alloy is 8 mass % or less, even lower resistivity can be attained, and efficiency in production of phosphorus-containing copper alloy particles can be favorable. If the phosphorus content is 6 mass % or more, even more excellent oxidation resistance can be attained.

As a phosphorus-containing copper alloy, a brazing material referred to as a copper-phosphorus brazing alloy (phosphorus concentration: approximately 7 mass % or less) is known. The copper-phosphorus brazing alloy is used also as a jointing material of copper and copper. By using phosphorus-containing copper alloy particles in the composition for an electrode, an electrode that exhibits excellent oxidation resistance and a low resistivity can be formed by means of a reducing property of phosphorus with respect to oxidized copper. In addition, it becomes possible to carry out sintering of the electrode at low temperature, whereby the processing costs can be reduced.

The phosphorus-containing copper alloy particles are an alloy including copper and phosphorus, but may contain other atoms. Examples of other atoms include Ag, Mn, Sb, Si, K, Na, Li, Ba, Sr, Ca, Mg, Be, Zn, Pb, Cd, Tl, V, Sn, Al, Zr, W, Mo, Ti, Co, Ni and Au.

The content of other atoms in the phosphorus-containing copper alloy particles may be, for example, 3 mass % or less of the phosphorus-containing copper alloy particles, and is preferably 1 mass % or less from the viewpoints of oxidation resistance and low resistivity.

In the present invention, the phosphorus-containing copper alloy particles may be used singly or in a combination of two or more kinds.

Although the particle size of the phosphorus-containing copper alloy particles is not particularly restricted, the particle size at an accumulated weight of 50% (hereinafter, also abbreviated as "D50%") from the smaller diameter side is preferably from 0.4 μm to 10 μm, and more preferably from 1

µm to 7 µm. If the particle size is 0.4 µm or more, oxidation resistance can be improved more efficiently. If the particle size is 10 µm or less, the contact area between phosphorus-containing copper alloy particles in the electrode is increased and the resistivity can be lowered more efficiently. The particle size of the phosphorus-containing copper alloy particles can be measured with a particle size distribution analyzer (MICROTRAC MT3300, trade name, manufactured by Nikkiso Co., Ltd.).

The shape of the phosphorus-containing copper alloy particles is not particularly restricted, and it may be any of quasispherical, flat, blocky, platy, scaly, etc. From the viewpoints of oxidation resistance and low resistivity, the phosphorus-containing copper alloy particles preferably have a quasispherical, flat or platy shape.

The content of the phosphorus-containing copper alloy particles, or the total content of the phosphorus-containing copper alloy particles and silver particles (when included), which will be described later, for example, can be from 70 mass % to 94 mass %. From the viewpoint of oxidation resistance and low resistivity, the content is preferably from 72 mass % to 90 mass %, more preferably from 74 mass % to 88 mass %.

Phosphorus-containing copper alloys can be produced by an ordinary method. Further, phosphorus-containing copper alloy particles can be produced from a phosphorus-containing copper alloy, in which the amount of phosphorus has been adjusted, by an ordinary method of preparing a metal powder, such as a water atomization method. Details of the water atomization method may be referred to the descriptions in Kinzoku Binran (Metals Handbook, published by Maruzen Co., Ltd.), etc.

More specifically, desired phosphorus-containing copper alloy particles can be produced by melting a phosphorus-containing copper alloy and making the same into a powder by spraying from nozzles, and then drying and classifying the obtained powder. Further, phosphorus-containing alloy particles having a desired particle diameter can be obtained by appropriately selecting the conditions for classification.

(Glass Particles)

The composition for an electrode includes at least one kind of glass particles. By including glass particles, adhesion between an electrode portion and a substrate can be improved during sintering. Further, a silicon nitride film, which is an antireflection coating, is removed by a so-called fire-through phenomenon during sintering, and an ohmic contact between an electrode and a semiconductor substrate is obtained.

As the glass particles, glass particles that are typically used in the field of the art can be used without particular restriction, as long as it can soften and melt at an electrode-forming temperature, oxidizing an antireflection film in contact with the glass particles, and taking in silicon dioxide that has been oxidized.

From the viewpoints of oxidation resistance and low resistivity of the electrode, the glass particles preferably has a glass softening point of 600° C. or less and a crystallization onset temperature of higher than 600° C. The glass softening point is measured by an ordinary method with a thermal mechanical analyzer (TMA), and the crystallization onset temperature is measured by an ordinary method with a thermogravimetric-differential thermal analyzer (TG-DTA).

Typically, glass particles included in a composition for an electrode are preferably composed of glass containing lead, in view of taking silicon dioxide efficiently. Examples of glass containing lead include those described in Japanese Patent No. 3050064, which can be suitably used in the present invention.

In consideration of environmental impacts, lead-free glass, which does not substantially contain lead, is preferably used. Examples of the lead-free glass include those described in paragraphs [0024] to [0025] of JP-A No. 2006-313744, and those described in JP-A No. 2009-188281, and any one of such lead-free glass are suitably used in the present invention.

Examples of the glass component of the glass particles to be used in the composition for an electrode include silicon dioxide ($SiO_2$), phosphorus oxide ($P_2O_5$), aluminum oxide ($Al_2O_3$), boron oxide ($B_2O_3$), vanadium oxide ($V_2O_5$), potassium oxide ($K_2O$), bismuth oxide ($Bi_2O_3$), sodium oxide ($Na_2O$), lithium oxide ($Li_2O$), barium oxide (BaO), strontium oxide (SrO), calcium oxide (CaO), magnesium oxide (MgO), beryllium oxide (BeO), zinc oxide (ZnO), lead oxide (PbO), cadmium oxide (CdO), tin oxide (SnO), zirconium oxide ($ZrO_2$), tungsten oxide ($WO_3$), molybdenum oxide ($MoO_3$), lanthanum oxide ($La_2O_3$), niobium oxide ($Nb_2O_5$), tantalum oxide ($Ta_2O_5$), yttrium oxide ($Y_2O_3$), titanium oxide ($TiO_2$), germanium oxide ($GeO_2$), tellurium oxide ($TeO_2$), lutetium oxide ($Lu_2O_3$), antimony oxide ($Sb_2O_3$), copper oxide (CuO), iron oxide (FeO), silver oxide (AgO) and manganese oxide (MnO).

Among these, at least one selected from the group consisting of $SiO_2$, $P_2O_5$, $Al_2O_3$, $B_2O_3$, $V_2O_5$, $Bi_2O_3$, ZnO and PbO is preferably used as the glass component. Specific examples include those including, as a glass component, $SiO_2$, PbO, $B_2O_3$, $Bi_2O_3$ and $Al_2O_3$. These glass particles can effectively lower the softening point. Further, since wettability with respect to phosphorus-containing copper alloy particles, or with respect to silver particles that are optionally included, can be improved, sintering among the particles in the sintering process is promoted and an electrode with even lower resistivity can be formed.

From the viewpoint of achieving a low contact resistivity, glass particles including phosphorus pentoxide (phosphate glass, $P_2O_5$ glass particles) are preferable, and glass particles containing vanadium pentoxide and phosphorus pentoxide ($P_2O_5$—$V_2O_5$ glass particles) are more preferable. By including vanadium pentoxide, oxidation resistance is further improved and resistivity of an electrode is further lowered. This is considered to be because of reduction in the softening point of the glass as a result of further including vanadium pentoxide, for example. In a case of using glass particles containing phosphorus pentoxide and vanadium pentoxide ($P_2O_5$—$V_2O_5$ glass particles), the content of vanadium pentoxide in the total mass of the glass is preferably 1 mass % or more, and more preferably from 1 mass % to 70 mass %.

Although the particle size of the glass particles is not particularly restricted, the particle size at an accumulated weight of 50% (D50%) is preferably 0.5 µm or more to 10 µm or less, and more preferably 0.8 µm or more to 8 µm or less. If the particle size is 0.5 µm or more, production of the composition for an electrode can be facilitated. If the particle size is 10 µm or less, the particles can be dispersed homogeneously in the composition for an electrode. As a result, fire-through can be efficiently caused during sintering, and adhesion with respect to a silicon substrate can be improved.

The content of the glass particles in the total mass of the composition for an electrode is preferably from 0.1 mass % to 10 mass %, more preferably from 0.5 mass % to 8 mass %, and further preferably from 1 mass % to 7 mass %. If the content of the glass particles is within the range, oxidation resistance, reduction in resistivity of an electrode, and reduction in contact resistance can be attained more effectively.

(Dispersing Medium)

The composition for an electrode includes at least one kind of a dispersing medium. By including a dispersing medium, properties of the composition for an electrode (such as viscosity or surface tension) or the aspect ratio of an electrode after sintering can be adjusted to favorable liquid properties that are necessary for a method of application to a semiconductor substrate.

The dispersing medium may be at least one kind of solvent, or may be a combination of at least one kind of solvent and at least one kind of resin, for example.

The solvent is not particularly restricted, and examples thereof include a hydrocarbon solvent, such as hexane, cyclohexane, and toluene; a chlorinated hydrocarbon solvent, such as dichloroethylene, dichloroethane, and dichlorobenzene; a cyclic ether solvent, such as tetrahydrofuran, furan, tetrahydropyran, pyran, dioxane, 1,3-dioxolane, and trioxane; an amide solvent, such as N,N-dimethylformamide, and N,N-dimethylacetamide; a sulfoxide solvent, such as dimethylsulfoxide, and diethylsulfoxide; a ketone solvent, such as acetone, methyl ethyl ketone, diethylketone, and cyclohexanone; an alcohol compound, such as ethanol, 2-propanol, 1-butanol, and diacetone alcohol; a polyhydric alcohol ester solvent, such as 2,2,4-trimethyl-1,3-pentanediol monoacetate, 2,2,4-trimethyl-1,3-pentanediol monopropiolate, 2,2,4-trimethyl-1,3-pentanediol monobutyrate, 2,2,4-trimethyl-1,3-pentanediol monoisobutyrate, 2,2,4-triethyl-1,3-pentanediol monoacetate, ethylene glycol monobutyl ether acetate, and diethylene glycol monobutyl ether acetate; a polyhydric alcohol ether solvent, such as butyl cellosolve, diethylene glycol monobutyl ether, and diethylene glycol diethyl ether; a terpene solvent, such as α-terpinene, α-terpineol, myrcene, allo-ocimene, limonene, dipentene, α-pinene, β-pinene, terpineol, carvone, ocimene, and phellandrene, and mixtures of these solvents.

From the viewpoint of application properties and printing properties of the composition for an electrode according to the present invention, the solvent is preferably at least one selected from a polyhydric alcohol ester solvent, a terpene solvent, and a polyhydric alcohol ether solvent, and at least one selected from a polyhydric alcohol ester solvent and a terpene solvent is more preferable.

The solvent may be used singly or in a combination of two or more kinds.

When the dispersing medium includes a resin, any resin that can be thermally decomposed during sintering can be used without particular restriction. Specific examples of the resin include cellulosic resin, such as methylcellulose, ethylcellulose, carboxymethylcellulose, and nitrocellulose; polyvinyl alcohol resin; polyvinylpyrrolidone resin; acrylic resin; vinyl acetate/acrylic ester copolymer resin; butyral resin such as polyvinyl butyral; alkyd resin, such as phenol-modified alkyd resin and castor oil fatty acid-modified alkyd resin; epoxy resin; phenol resin; and rosin ester resin.

From the viewpoint of a property of disappearance during sintering, at least one selected from a cellulosic resin or an acrylic resin is preferable, and at least one selected from a cellulosic resin is more preferred.

The resin may be used singly or in a combination of two or more kinds.

The weight-average molecular weight of the resin is not particularly restricted. The weight-average molecular weight is preferably 5,000 or more to 500,000 or more, and more preferably 10,000 or more to 300,000 or less. If the weight-average molecular weight of the resin is 5,000 or more, increase in viscosity of the composition for an electrode can be suppressed. This is considered to be, for example, because of aggregation of particles due to insufficient steric repulsion when the resin is adsorbed to phosphorus-containing copper alloy particles. If the weight-average molecular weight of the resin is 500,000 or less, aggregation of the resin in a solvent is suppressed, and increase in viscosity of the paste composition for an electrode can be suppressed.

In addition, if the weight-average molecular weight of the resin is within a suitable range, increase in a combustion temperature of the resin can be suppressed. As a result, formation of residues derived from insufficient combustion of the resin that occurs during sintering of the composition for an electrode can be suppressed. Accordingly, an electrode having even lower resistivity can be obtained.

The content of the dispersing medium in the composition for an electrode can be selected appropriately, depending on the desired properties and the type of the dispersing medium. For example, the content of the dispersing medium in the total mass of the composition for an electrode is preferably from 3 mass % or more to 29.9 mass % or less, more preferably from 5 mass % or more to 25 mass % or less, and further preferably from 7 mass % or more to 20 mass % or less.

If the content of the dispersing medium is within the range, application suitability of the composition for an electrode to a silicon substrate may become favorable, and an electrode having a desired width and a height can be formed more easily.

(Silver Particles)

The composition for an electrode according to the present invention preferably further includes silver particles. By including silver particles, oxidation resistance can be further improved and resistivity of an electrode can be further lowered. In addition, in a case of forming a photovoltaic cell module, an effect of improving the solder jointing property can be obtained. The reason for this is, for example, considered to be as follows.

In a temperature range of from 600° C. to 900° C., in which an electrode is typically formed, solid solution of a small amount of silver into copper and solid solution of a small amount of copper into silver are caused, and a layer of a copper-silver solid solution (solid solution region) is formed at an interface of copper and silver. When a mixture of phosphorus-containing copper alloy particles and silver particles is heated to high temperature and then slowly cooled to room temperature, it is considered that a solid solution region is not formed. However, since the mixture is cooled from high temperature to room temperature within several seconds during formation of an electrode, it is considered that a layer in the form of a solid solution at high temperature covers the surface of the silver particles and the phosphorus-containing copper alloy particles as a non-equilibrium solid solution phase or as an eutectic structure of copper and silver. Such a copper-silver solid solution layer is considered to contribute to further improvement in oxidation resistance of the phosphorus-containing copper alloy particles at an electrode-forming temperature.

Silver that constitutes the silver particles may further contain other atoms that may be unavoidably incorporated therein. Examples of the other atoms include Sb, Si, K, Na, Li, Ba, Sr, Ca, Mg, Be, Zn, Pb, Cd, Tl, V, Sn, Al, Zr, W, Mo, Ti, Co, Ni, and Au.

The content of the other atoms in the silver particles may be, for example, 3 mass % or less of the silver particles, and from the viewpoints of the melting point and reduction in resistivity of an electrode, the content of the other atoms is preferably 1 mass % or less.

Although the particle size of the silver particles used in the present invention is not particularly restricted, the particle size at an accumulated weight of 50% (D50%) is preferably from 0.4 µm or more to 10 µm or less, and more preferably from 1 µm or more to 7 µm or less. If the particle size is 0.4 µm or more, oxidation resistance can be improved more effectively. If the particle size is 10 µm or less, the contact area between the silver particles and the phosphorus-containing copper alloy particles in the electrode can be increased, and the resistivity can be lowered more effectively.

When the composition for an electrode includes silver particles, the relationship between the particle size of the phosphorus-containing copper alloy particles (D50%) and the particle size of the silver particles (D50%) is not particularly restricted. It is preferred that either one of the phosphorus-containing copper alloy particles and the silver particles have a smaller particles size (D50%) than the particle size (D50%) of the other, and it is more preferred that the ratio of particle size (D50%) of either one of the phosphorus-containing copper alloy particles and the silver particles with respect to the particle size (D50%) of the other is from 1 to 10. In that case, resistivity of an electrode tends to decrease more effectively. This is considered to be, for example, because a contact area among the metal particles (phosphorus-containing copper alloy particles and the silver particles) in the electrode is increased.

From the viewpoint of oxidation resistance and a low resistivity of the electrode, the content of the silver particles in the composition for an electrode is preferably from 8.4 mass % to 85.5 mass %, more preferably from 8.9 mass % to 80.1 mass %.

Further, when the composition for an electrode includes silver particles, from the viewpoint of suppressing the cost for the raw materials while achieving oxidation resistance and a low resistivity of an electrode, the content of the silver particles is preferably from 5 mass % to 65 mass %, more preferably from 7 mass % to 60 mass %, further preferably from 10 mass % to 55 mass %, when the total content of the phosphorus-containing copper alloy particles and the silver particles is 100 mass %.

Further, when the composition for an electrode includes silver particles, from the viewpoint of achieving oxidation resistance and a low resistivity of an electrode, and easily carrying out application of the composition onto a semiconductor substrate, the total content of the phosphorus-containing copper alloy particles and the silver particles in the composition for an electrode is preferably 70 mass % or more to 94 mass % or less, and more preferably 74 mass % or more to 88 mass % or less. If the total content of the phosphorus-containing copper alloy particles and the silver particles is 70 mass % or more, a favorable viscosity for application of the composition for an electrode can be easily obtained. If the total content of the phosphorus-containing copper alloy particles and the silver particles is 94 mass % or less, unevenness during application of the composition for an electrode can be more effectively suppressed.

Further, when the composition for an electrode includes silver particles, from the viewpoints of oxidation resistance and a low resistivity of an electrode, it is preferred that the total content of the phosphorus-containing copper alloy particles and the silver particles is 70 mass % or more to 94 mass % or less, the content of the glass particles is 0.1 mass % or more to 10 mass % or less, and the content of the dispersing medium is 3 mass % or more to 29.9 mass % or less; it is more preferred that the total content of the phosphorus-containing copper alloy particles and the silver particles is 74 mass % or more to 88 mass % or less, the content of the glass particles is 0.5 mass % or more to 8 mass % or less, and the content of the dispersing medium is 7 mass % or more to 20 mass % or less; and it is further preferred that the total content of the phosphorus-containing copper alloy particles and the silver particles is 74 mass % or more to 88 mass % or less, the content of the glass particles is 1 mass % or more to 7 mass % or less, and the content of the dispersing medium is 7 mass % or more to 20 mass % or less.

(Flux)

The composition for an electrode may further include at least one kind of flux. By including a flux, oxidation resistance may be further improved and the resistivity of the electrode may be further lowered. In addition, an effect of improving the adhesion between the electrode and the semiconductor substrate may be achieved.

The flux is not particularly restricted, insofar as it is capable of removing an oxidized film formed on surfaces of phosphorus-containing copper alloy particles. Preferred examples of the flux include a fatty acid, a boric acid compound, a fluoride compound, and a fluoroborate compound.

More specific examples of the flux include lauric acid, myristic acid, palmitic acid, stearic acid, sorbic acid, stearolic acid, propionic acid, boron oxide, potassium borate, sodium borate, lithium borate, potassium fluoroborate, sodium fluoroborate, lithium fluoroborate, potassium bifluoride, sodium bifluoride, lithium bifluoride, potassium fluoride, sodium fluoride, and lithium fluoride.

Among them, from the viewpoints of heat resistance during a process of sintering the composition for an electrode (i.e., a property of not volatilizing at a low temperature stage of sintering) and supplementing the oxidation resistance of the phosphorus-containing copper alloy particles, potassium borate, potassium fluoroborate and the like are especially preferred.

The flux may be used singly or in a combination of two or more kinds.

When the composition for an electrode includes a flux, from the viewpoints of allowing the phosphorus-containing copper alloy particles to effectively exhibit oxidation resistance and reducing the void ratio at portions from which the flux has been removed after the completion of the sintering, the content of the flux in the total mass of the composition for an electrode is preferably from 0.1 mass % to 5 mass %, more preferably from 0.3 mass % to 4 mass %, further preferably from 0.5 mass % to 3.5 mass %, yet further preferably from 0.7 mass % to 3 mass %, and particularly preferably from 1 mass % to 2.5 mass %.

(Other Components)

The composition for an electrode may include other components that are commonly used in the field of the art, in addition to the components as described above, as necessary. Examples of the other components include a plasticizer, a dispersant, a surfactant, an inorganic binder, a metal oxide, a ceramic compound, and an organometallic compound.

The method for producing the composition for an electrode is not particularly restricted. For example, the composition for an electrode according to the present invention can be produced by mixing and dispersing the phosphorus-containing copper alloy particles, glass particles, a dispersing medium, and silver particles or the like that may be optionally included, by an ordinary method.

Although not particularly restricted, the composition for an electrode is preferably in the form of a paste, from the viewpoint of application suitability onto a semiconductor substrate and achieving a desired aspect ratio. The viscosity of the composition for an electrode may be adjusted according to purposes.

<Method of Producing Electrode>

As the method of producing an electrode with the composition for an electrode, for example, there is a method in which an electrode is formed at desired portions by applying the composition for an electrode to a region at which an electrode is to be formed, and drying and sintering the same. By using the composition for an electrode, an electrode having a low resistivity can be formed even if the sintering is carried out in the presence of oxygen (e.g. in the atmosphere).

Specifically, for example, an electrode with a low resistivity can be formed in a desired shape by applying the composition for an electrode onto a semiconductor substrate in a desired shape, and drying and sintering the same. By using the composition for an electrode, an electrode with a low resistivity can be formed even if the sintering is carried out in the presence of oxygen (e.g. in the atmosphere).

Examples of the application method of the composition for an electrode include a screen printing method, an inkjet method and a dispenser method. From the viewpoint of productivity, a screen printing method is preferable.

If the composition for an electrode is applied by screen printing, the composition for an electrode preferably has a viscosity of from 20 Pa·s to 1000 Pa·s. The viscosity can be measured with a Brookfield HBT viscometer at 25° C.

The application amount of the composition for an electrode can be selected appropriately, according to the size of an electrode to be formed. The application amount of the composition for an electrode may be, for example, from 2 $g/m^2$ and 10 $g/m^2$, preferably from 4 $g/m^2$ and 8 $g/m^2$.

With regard to the conditions for heat treatment (sintering) for forming an electrode with the composition for an electrode, heat treatment conditions that are common in the field of the art may be employed.

The heat treatment temperature (sintering temperature) is typically from 800° C. to 900° C. However, in a case of using the composition for an electrode, heat treatment conditions at lower temperatures may be applied. For example, an electrode that exhibits favorable properties can be formed at a heat treatment temperature of from 600° C. to 850° C.

The heat treatment time may be selected appropriately according to the heat treatment temperature or the like, and may be, for example, from 1 second to 20 seconds.

The heat treatment equipment may be appropriately selected from those that can heat up to a temperature within the range as described above, and examples thereof include an infrared heating oven and a tunnel oven. An infrared heating oven, in which electrical energy is input directly to a heated material in the form of electromagnetic waves and is converted to thermal energy, is highly efficient and capable of performing rapid heating in a short time. Further, since no combustion product is generated and heating is carried out in a non-contact manner, contamination of an electrode to be formed can be suppressed. A tunnel oven, in which sintering is carried out during conveying a sample in an automatic and continuous manner from an inlet to an outlet, is capable of carrying out heating uniformly by dividing the oven and controlling the conveying speed. From the viewpoint of obtaining an electrode having a low resistivity, a tunnel oven is suitable for carrying out the heat treatment.

<Application>

The application of the element is not specifically restricted. For example, the element can be used for photovoltaic cell elements, plasma display elements, ceramic condenser elements, antenna circuits, various sensor circuits, and radiators for semiconductor devices. Typically, a texture having an uneven shape is formed on a light-receiving surface of a semiconductor substrate for a photovoltaic cell. According to the invention, an electrode having a low resistivity can be formed even if a texture is formed on the semiconductor substrate.

<Photovoltaic Cell Element>

In the photovoltaic cell element of the invention, the substrate has an impurity diffusion layer, and the electrode is formed on the impurity diffusion layer. As a result, a photovoltaic cell element that exhibits favorable characteristics is obtained, and the productivity of the photovoltaic cell element is excellent. In an embodiment in which the photovoltaic cell element has a surface electrode on a light-receiving surface of the element and a back surface electrode on the back surface of the element, it is preferable that the surface electrode provided on the light-receiving surface satisfy an aspect ratio as specified above.

In the present specification, the term "photovoltaic cell element" refers to an element including a semiconductor substrate having a pn-junction, and an electrode formed on the semiconductor substrate. The term "photovoltaic cell" refers to an assembly that includes an electrode for a photovoltaic cell element having a tab wire provided thereon. As necessary, the photovoltaic cell may have a structure in which plural photovoltaic cell elements are connected to each other via tab wires.

In the following, specific examples of the photovoltaic cell element will be described with reference to the drawings. However, the invention is not limited thereto.

Figure 2:
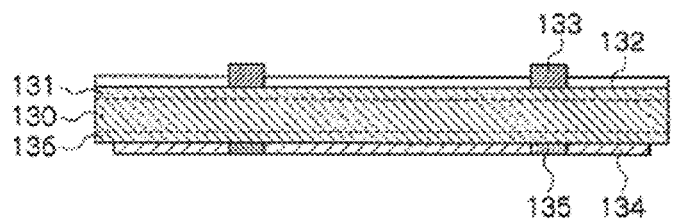
FIG. 2 is a cross-sectional view of a photovoltaic cell element of an embodiment of the invention.
Figure 4:
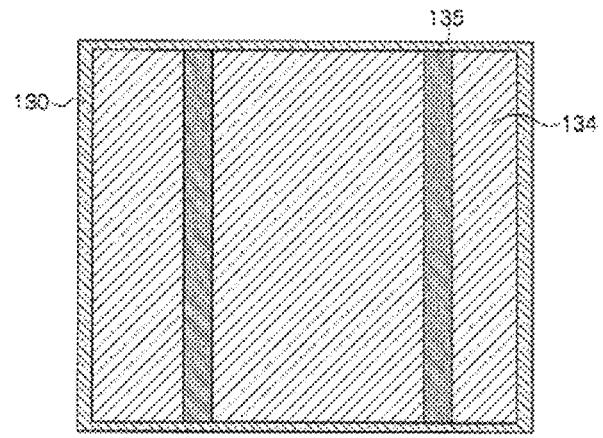
FIG. 4 is a plan view of a back surface side of a photovoltaic cell element of an embodiment of the invention.

FIG. 2, FIG. 3 and FIG. 4 show schematic views of a cross section, a light-receiving surface and a back surface of an example of a typical photovoltaic cell element, respectively.

As shown in FIG. 2, a monocrystalline or polycrystalline silicon substrate or the like is typically used as a semiconductor substrate 130 of a photovoltaic cell element. The semiconductor substrate 130 includes boron and the like, and constitutes a p-type semiconductor. In order to suppress reflection of sunlight, the light-receiving surface side of the substrate has asperity (also referred to as a "texture", not shown in the figure) by etching. The light-receiving surface side of the semiconductor substrate 130 is doped with phosphorus or the like, thereby forming a n-type semiconductor diffusion layer 131 having a thickness of a sub-micron scale and a pn-junction region at an interface with a p-type bulk portion. Furthermore, on the diffusion layer 131, an antireflection layer 132 made from silicon nitride or the like is provided by a deposition method or the like, to a thickness of approximately 100 nm.

As shown in FIG. 3, a light-receiving surface electrode 133 includes plural finger electrodes 140 and bus bar electrodes 142 that intersect with the plural finger electrodes 140. In the photovoltaic cell element, at least one of the finger electrode or the bus bar electrode correspond to the line-shaped electrode.

When the finger electrode is the line-shaped electrode, the aspect ratio of the finger electrode is preferably from 2:1 to 50:1, more preferably from 2:1 to 30:1, further preferably from 3:1 to 20:1. The short length (width) of the finger electrode is preferably from 30 μm to 200 μm, more preferably from 50 μm to 180 μm, further preferably from 50 μm to 150 μm.

When the bus bar electrode is the line-shaped electrode, the aspect ratio of the bus bar electrode is preferably from 25:1 to 250:1, more preferably from 25:1 to 230:1, further preferably from 30:1 to 200:1. The short length (width) of the bus bar electrode is preferably from 100 μm to 2000 μm, more preferably from 200 μm to 1800 μm, further preferably from 300 μm to 1600 μm.

The position for the electrode is not limited to the light-receiving surface. However, the effect attained by satisfying the aspect ratio as specified above is particularly significant when the electrode is positioned on the light-receiving surface.

The aspect ratio of the finger electrode 140 is an average value of aspect ratios obtained by measuring the short length and the height at 10 points of a finger electrode. Similarly, the aspect ratio of the bus bur electrode 142 is an average value of aspect ratios obtained by measuring the short length and the height at 10 points of a bus bur electrode.

Next, the light-receiving surface electrode 133, a collecting electrode 134 and a power output electrode 135 are described. The light-receiving surface electrode 133 is provided on the light-receiving surface, and the collecting electrode 134 and the power output electrode 135 are provided on the back surface. The light-receiving surface electrode 133 and the power output electrode 135 are formed from the composition for an electrode. The collecting electrode 134 is formed from an aluminum electrode paste composition including a glass powder. These electrodes may be formed, for example, by applying the composition in a desired pattern by screen printing or the like, and then drying and sintering the same in the atmosphere at about 600° C. to about 850° C.

By using the composition for an electrode, an electrode having an excellent resistivity and an excellent contact resistivity can be formed even if the sintering is carried out at relatively low temperatures.

During the sintering, the glass particles included in the composition for an electrode, which forms the light-receiving surface electrode 133, react with the antireflection layer 132 at the light-receiving surface side (fire-through). As a result, the light-receiving surface electrode 133 is electrically connected to the diffusion layer 131 (ohmic contact).

In the invention, since the light-receiving surface electrode 133 is formed from the composition for an electrode, oxidation of copper is suppressed in spite of the presence thereof as an electroconductive metal. Thus, a light-receiving surface electrode 133 having a low resistivity is formed with a favorable productivity.

As shown in FIG. 4, at the back surface side of the photovoltaic cell element, an electrode component diffusion layer 136 is formed during sintering by diffusion of aluminum included in the aluminum electrode paste composition for forming the collecting electrode 134. As a result, an ohmic contact is achieved between the semiconductor substrate 130 and the collecting electrode 134 and the power output electrode 135.

Figure 5:
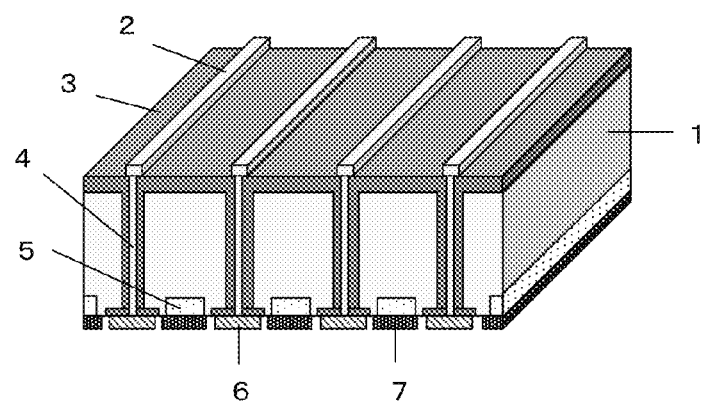
FIG. 5 is an oblique perspective view of a back contact-type photovoltaic cell element as an example of a photovoltaic cell element of an embodiment of the invention, which shows a structure at an AA section shown in FIG. 6.
Figure 6:
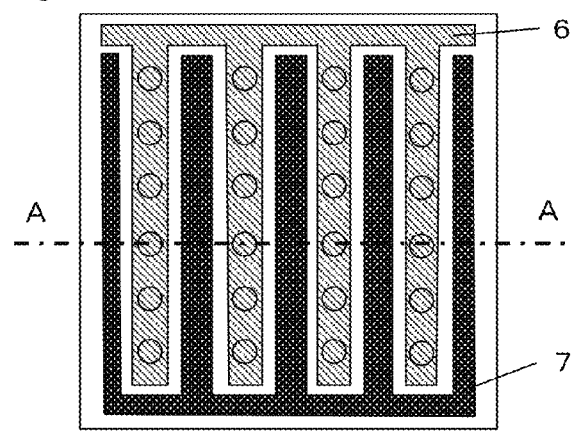
FIG. 6 is a plan view of a back contact-type photovoltaic cell element as an example of a photovoltaic cell element of an embodiment of the invention, which shows a structure of an electrode at the back surface side.

FIG. 5 and FIG. 6 are views of a back-contact type photovoltaic cell element that is another example of the photovoltaic cell element. FIG. 5 is a schematic perspective view of an AA cross-sectional constitution shown in FIG. 6, and FIG. 6 is a schematic plan view of the electrode structure at the back surface side.

As shown in the schematic perspective view of FIG. 5, through-holes that penetrate from the light-receiving surface side to the back surface side of a cell wafer 1, which is formed from a p-type semiconductor substrate, are formed by laser drilling, etching or the like. A texture (not shown) that improves the light incidence efficiency is formed at the light-receiving surface side of the cell wafer 1. Furthermore, an n-type semiconductor layer 3 is formed at the light-receiving surface side of the cell wafer 1 by an n-type diffusion treatment, and an antireflection coating (not shown) is formed on the n-type semiconductor layer 3. These elements may be formed in a similar manner to the production of conventional crystalline Si-type photovoltaic cell elements.

The through-holes are filled with the composition for an electrode by a printing method, an inkjet method or the like. Furthermore, the composition for an electrode is applied by printing into a grid form on the antireflection coating which has been formed at the light-receiving surface side. The compositions for an electrode are sintered, and the through-hole electrodes 4 and the collecting grid electrode 2 are formed.

The composition used for filling and the composition used for printing are desirably selected from those that are suitable for respective processes. However, it is also possible to use the same composition and perform the filling and the printing at the same time.

On the side opposite to the light-receiving surface (back surface), a high-concentration dope layer 5 that functions to prevent recombination of carriers is formed. Boron, aluminum or the like is used as an impurity element for forming the high-concentration dope layer 5, and a p$^+$-type diffusion layer is formed. For example, the high-concentration dope layer 5 may be formed by performing a heat diffusion treatment with boron as a diffusion source prior to the process of producing a cell on which the antireflection film has not been formed. In a case of using aluminum, the high-concentration dope layer 5 may be formed by applying an aluminum paste by printing in the printing process as described above.

By sintering the element on which the composition for an electrode has been applied at from 650° C. to 850° C., the composition for an electrode that fills the through holes or forms a grid pattern on the antireflection film on the light-receiving surface are electrically connected to the underlying n-type diffusion layer, and an ohmic contact is achieved.

On the opposite side, as shown in FIG. 6, back surface electrodes 6 and 7, of n-side and p-side, are formed by printing the composition for an electrode in the form of stripes and sintering the same.

In the invention, by using the composition for an electrode to form the through-hole electrode 4, the collecting grid electrode 2, the back-surface electrode 6 and the back-surface electrode 7, these electrodes exhibit a low resistivity and are formed at high productivity.

The use of the composition for an electrode is not limited to formation of an electrode for photovoltaic cells, and examples of the suitable applications include electrode wiring and shielding wiring for plasma display devices, ceramic condensers, antenna circuits, various sensor circuits and radiators for semiconductor devices.

<Photovoltaic Cell>

The photovoltaic cell includes the element for a photovoltaic cell, and a tab line disposed on the electrode of the element. The photovoltaic cell may have a structure in which plural photovoltaic cell elements are connected via tab wires, and the structure may be sealed with a sealing material.

The tab wire and the sealing material are not particularly restricted, and may be selected from materials that are typically used in the field of the art.

EXAMPLES

In the following, the invention is described in detail with reference to the Examples. However, the invention is not limited to the Examples. Unless otherwise specified, "parts" and "%" are on the mass basis.

Example 1

(a) Preparation of Composition for Electrode

Phosphorus-containing copper alloy particles including 7 mass % of phosphorus were prepared by an ordinary method. The obtained phosphorus-containing copper alloy particles were melted and made into a powder by a water atomization method. The powder was dried and classified. The classified powder was blended and subjected to a deoxidation treatment and a dehydration treatment, thereby obtaining phosphorus-containing copper alloy particles including 7 mass % of phosphorus. The particle size (D50%) of the phosphorus-containing copper alloy particles was 1.5 μm.

A glass (hereinafter, also referred to as G1) including 3 parts of silicon dioxide ($SiO_2$), 60 parts of lead oxide (PbO), 18 parts of boron oxide ($B_2O_3$), 5 parts of bismuth oxide ($Bi_2O_3$), 5 parts of aluminum oxide ($Al_2O_3$) and 9 parts of zinc oxide (ZnO) was prepared.

The softening point of the obtained glass G1 was 420° C., and the crystallization onset temperature was over 600° C.

Glass particles having a particle size (D50%) of 1.7 μm were prepared from glass G1.

A composition for an electrode 1 was prepared by mixing 85.1 parts of the phosphorus-containing copper alloy particles obtained in the above process, 1.7 parts of glass particles (G1) and 13.2 parts of a solution of terpineol (mixture of isomers) containing 3 mass % of ethyl cellulose (EC, weight average molecular weight: 190,000), and blending the same in an agate mortar for 20 minutes.

(b) Preparation of Photovoltaic Cell

A p-type semiconductor substrate having a light-receiving surface on which an n-type semiconductor layer, a texture and an antireflection film (silicon nitride film) were formed (thickness: 190 μm) was cut into a size of 125 mm×125 mm.

On the light-receiving surface, the composition for an electrode 1 was applied by screen printing in an electrode pattern as shown in FIG. 3. The electrode pattern included a finger line having a short length (width) of 150 μm and a bus bar having a short length (width) of 1.5 mm, and the printing conditions (mesh, printing rate and printing pressure) were adjusted such that an intended aspect ratio was achieved. The resultant was placed in an oven heated at 150° C. for 15 minutes in order to evaporate the solvent.

Subsequently, an aluminum electrode paste was applied on the entire region of the back surface of the semiconductor substrate by screen printing. The printing conditions were adjusted such that the thickness after sintering was 40 μm. The resultant was placed in an oven heated at 150° C. for 15 minutes in order to evaporate the solvent.

Thereafter, the semiconductor substrate was subjected to a heat treatment (sintering) with a tunnel oven (single-line conveyer WB tunnel oven, manufactured by Noritake Co., Limited) in the atmosphere with a retention time of 10 seconds at a maximum sintering temperature of 850° C. A photovoltaic cell element 1 on which electrodes were formed was thus prepared.

The aspect ratio of the finger electrode was 10:1 and the aspect ratio of the bus bar electrode was 100:1, respectively. The aspect ratio of the light-receiving side electrode was calculated from a surface profile measured with a stylus surface profilometer (XP-2, trade name, manufactured by Ambios Technology, Inc.)

Example 2

A photovoltaic cell element 2 was prepared in a similar manner to Example 1, except that the printing conditions were changed such that the aspect ratio of the finger electrode after sintering was 15:1 and the aspect ratio of the bus bar electrode after sintering was 150:1, respectively.

Example 3

A photovoltaic cell element 3 was prepared in a similar manner to Example 1, except that the printing conditions were changed such that the aspect ratio of the finger electrode after sintering was 20:1 and the aspect ratio of the bus bar electrode after sintering was 200:1, respectively.

Example 4

A photovoltaic cell element 4 was prepared in a similar manner to Example 1, except that the printing conditions were changed such that the aspect ratio of the finger electrode after sintering was 5:1 and the aspect ratio of the bus bar electrode after sintering was 50:1, respectively.

Example 5

A photovoltaic cell element 5 was prepared in a similar manner to Example 1, except that the printing conditions were changed such that the aspect ratio of the finger electrode after sintering was 3:1 and the aspect ratio of the bus bar electrode after sintering was 30:1, respectively.

Example 6

A composition for an electrode 6 and a photovoltaic cell element 6 were prepared in a similar manner to Example 1, except that the phosphorus content of the phosphorus-containing copper alloy particles was changed from 7 mass % to 8 mass %.

Example 7

A composition for an electrode 7 and a photovoltaic cell element 7 were prepared in a similar manner to Example 1, except that the particle size of the phosphorus-containing copper alloy particles was changed from 1.5 μm to 5.0 μm.

Example 8

A composition for an electrode 8 and a photovoltaic cell element 8 were prepared in a similar manner to Example 7, except that silver particles (particles size (D50%): 3.0 μm, a high-purity chemical product manufactured by Sigma-Aldrich Co., LLC) were added to the composition for an electrode.

Specifically, the composition for an electrode 8 including 75.0 parts of phosphorus-containing copper alloy particles (phosphorus content: 7 mass %, particle size (D50%): 5.0 μm), 10.1 parts of the silver particles, 1.7 parts of glass particles (G1) and 13.2 parts of a solution of terpineol (mixture of isomers) containing 3 mass % of ethyl cellulose (EC) was prepared, and the photovoltaic cell element 8 was produced.

Examples 9 to 15

Compositions for an electrode 9 to 15 were prepared in a similar manner to Example 1, respectively, except that the phosphorus content, particle size (D50%) and the amount of the phosphorus-containing copper alloy particles, the type and the amount of the silver particles, and the amount of the terpineol solution containing ethyl cellulose (EC) were changed, as described in Table 1.

The glass particles (G2) were prepared from 45 parts of vanadium oxide ($V_2O_5$), 24.2 parts of phosphorus oxide ($P_2O_5$), 20.8 parts of barium oxide (BaO), 5 parts of antimony oxide ($Sb_2O_3$) and 5 parts of tungsten oxide ($WO_3$). The particle size (D50%) of the glass particles (G2) was 1.7 μm.

The softening point of the glass (G2) was 492° C., and the crystallization onset temperature was over 600° C.

Subsequently, photovoltaic cells 9 to 15 were prepared by forming an electrode from the compositions for an electrode 9 to 15, respectively, except that the temperature and the time for the heat treatment and the aspect ratio of the electrode after sintering were changed, as described in Table 1.

Comparative Example 1

A composition for an electrode C1 was prepared in a similar manner to Example 1, except that the phosphorus-containing copper alloy particles were not used in the preparation of the composition for an electrode and the contents of the components were changed, as described in Table 1.

were changed such that the aspect ratio of the finger electrode after sintering was 30:1 and the aspect ratio of the bus bar electrode after sintering was 300:1, respectively.

Comparative Example 5

A composition for an electrode C5 was prepared in a similar manner to Example 1, except that pure copper particles (phosphorus content: 0%) were used instead of the phosphorus-containing copper alloy particles.

A photovoltaic cell element C5 was prepared in a similar manner to Example 1, except that the composition for an electrode C5 was used.

TABLE 1

| Example | Phosphorus-containing copper alloy particles | | | Silver particles | | Glass particles | | | 3 mass % EC containing terpineol solution (parts) | Sintering conditions | | Aspect ratio of light-receiving surface electrode | |
|---|---|---|---|---|---|---|---|---|---|---|---|---|---|
| | Phosphorus content (mass %) | Particle size (D50%) (μm) | Content (parts) | Particle size (D50%) (μm) | Content (parts) | Type | Particle size (D50%) (μm) | Content (parts) | | Maximum temperature (°C.) | Retention time (sec) | Finger electrode w:h | Bus bar electrode w:h |
| Example 1 | 7 | 1.5 | 85.1 | — | 0.0 | G1 | 1.7 | 1.7 | 13.2 | 850 | 10 | 10:1 | 100:1 |
| Example 2 | 7 | 1.5 | 85.1 | — | 0.0 | G1 | 1.7 | 1.7 | 13.2 | 850 | 10 | 15:1 | 150:1 |
| Example 3 | 7 | 1.5 | 85.1 | — | 0.0 | G1 | 1.7 | 1.7 | 13.2 | 850 | 10 | 20:1 | 200:1 |
| Example 4 | 7 | 1.5 | 85.1 | — | 0.0 | G1 | 1.7 | 1.7 | 13.2 | 850 | 10 | 5:1 | 50:1 |
| Example 5 | 7 | 1.5 | 85.1 | — | 0.0 | G1 | 1.7 | 1.7 | 13.2 | 850 | 10 | 3:1 | 30:1 |
| Example 6 | 8 | 1.5 | 85.1 | — | 0.0 | G1 | 1.7 | 1.7 | 13.2 | 850 | 10 | 10:1 | 100:1 |
| Example 7 | 7 | 5.0 | 85.1 | — | 0.0 | G1 | 1.7 | 1.7 | 13.2 | 850 | 10 | 10:1 | 100:1 |
| Example 8 | 7 | 5.0 | 75.0 | 3.0 | 10.1 | G1 | 1.7 | 1.7 | 13.2 | 850 | 10 | 10:1 | 100:1 |
| Example 9 | 7 | 1.5 | 85.1 | — | 0.0 | G1 | 1.7 | 1.7 | 13.2 | 800 | 10 | 20:1 | 200:1 |
| Example 10 | 6 | 1.5 | 84.8 | — | 0.0 | G2 | 1.7 | 2.0 | 13.2 | 850 | 10 | 15:1 | 150:1 |
| Example 11 | 6 | 1.5 | 59.5 | 3.0 | 25.6 | G2 | 1.7 | 1.7 | 13.2 | 850 | 10 | 10:1 | 100:1 |
| Example 12 | 7 | 5.0 | 81.7 | — | 0.0 | G1 | 1.7 | 1.5 | 16.8 | 800 | 10 | 10:1 | 100:1 |
| Example 13 | 7 | 5.0 | 73.3 | 3.0 | 10.1 | G1 | 1.7 | 3.4 | 13.2 | 850 | 10 | 20:1 | 200:1 |
| Example 14 | 8 | 5.0 | 85.1 | 3.0 | 10.1 | G2 | 1.7 | 1.7 | 13.2 | 850 | 10 | 15:1 | 150:1 |
| Example 15 | 7 | 5.0 | 85.1 | — | 0.0 | G1 | 1.7 | 1.7 | 13.2 | 750 | 15 | 10:1 | 100:1 |
| Comp. Ex. 1 | — | — | 0.0 | 3.0 | 85.1 | G1 | 1.7 | 1.7 | 13.2 | 850 | 10 | 10:1 | 100:1 |
| Comp. Ex. 2 | — | — | 0.0 | 3.0 | 85.1 | G1 | 1.7 | 1.7 | 13.2 | 850 | 10 | 20:1 | 200:1 |
| Comp. Ex. 3 | 7 | 1.5 | 85.1 | — | 0.0 | G1 | 1.7 | 1.7 | 13.2 | 850 | 10 | 1.5:1 | 15:1 |
| Comp. Ex. 4 | 7 | 1.5 | 85.1 | — | 0.0 | G1 | 1.7 | 1.7 | 13.2 | 850 | 10 | 30:1 | 300:1 |
| Comp. Ex. 5 | 0 | 1.5 | 85.1 | — | 0.0 | G1 | 1.7 | 1.7 | 13.2 | 850 | 10 | 10:1 | 100:1 |

A photovoltaic cell C1 was prepared in a similar manner to Example 1, except that the composition for an electrode C1, not including the phosphorus-containing copper alloy particles, was used.

Comparative Example 2

A photovoltaic cell element C2 was prepared in a similar manner to Comparative Example 1, except that the printing conditions were changed such that the aspect ratio of the finger electrode after sintering was 20:1 and the aspect ratio of the bus bar electrode after sintering was 200:1, respectively.

Comparative Example 3

A photovoltaic cell element C3 was prepared in a similar manner to Example 1, except that the printing conditions were changed such that the aspect ratio of the finger electrode after sintering was 1.5:1 and the aspect ratio of the bus bar electrode after sintering was 15:1, respectively.

Comparative Example 4

A photovoltaic cell element C4 was prepared in a similar manner to Example 1, except that the printing conditions <Evaluation>

The evaluation of the photovoltaic cell elements prepared in the Examples and the Comparative Examples were carried out by combining a solar simulator (WXS-155S-10, trade name, manufactured by Wacom Electric Co., Ltd.) and a current-voltage (I-V) measurement apparatus (I-V CURVE TRACER MP-160, trade name, manufactured by Eko Instruments Co., Ltd.)

The evaluation was carried out by measuring Eff (conversion efficiency), FF (fill factor), Voc (open circuit voltage) and Jsc (short circuit current) with reference to JIS-C-8912, JIS-C-8913 and JIS-C-8914, respectively. The measured values were converted to relative values with respect to the measured values of Comparative Example 1 defined as 100.0. The results are shown in Table 2.

In Comparative Example 3, the height of the finger electrode was too high with respect to the short length, and the finger electrode was detached from the substrate during sintering. As a result, it is considered that collection of carriers generated by light irradiation was insufficient, whereby the power generation properties were lowered.

In Comparative Example 4, the height of the finger electrode was too low with respect to the short length, and the irregular shape of the texture was not sufficiently covered by the electrode. As a result, it is considered that the wiring resistance at the time of extracting carriers generated by light irradiation was increased, whereby the power generation properties were lowered.

In Comparative Example 5, the resistivity of the electrode was too large due to oxidation of copper particles, and was not measurable.

containing copper alloy particles is promoted. Therefore, an electrode that is more dense and has an even lower resistivity can be formed and the fire through can be achieved more effectively. Accordingly, an effect of improving an ohmic contact property between an electrode and a semiconductor substrate can be achieved.

TABLE 2

| Example | Power generation performances | | | |
|---|---|---|---|---|
| | Jsc (relative value) short circuit current | Voc (relative value) open circuit voltage | F.F. (relative value) fill factor | Eff (relative value) conversion efficiency |
| Example 1 | 100.5 | 100.1 | 100.3 | 100.9 |
| Example 2 | 99.7 | 100.2 | 99.9 | 99.7 |
| Example 3 | 99.4 | 99.8 | 100.0 | 100.1 |
| Example 4 | 100.2 | 100.3 | 100.2 | 100.0 |
| Example 5 | 99.8 | 99.5 | 99.2 | 99.0 |
| Example 6 | 98.0 | 100.2 | 99.4 | 99.4 |
| Example 7 | 101.1 | 100.3 | 100.7 | 100.4 |
| Example 8 | 103.2 | 100.7 | 100.3 | 101.0 |
| Example 9 | 99.2 | 100.4 | 100.3 | 100.1 |
| Example 10 | 100.2 | 100.6 | 100.7 | 100.2 |
| Example 11 | 102.7 | 99.8 | 100.8 | 101.8 |
| Example 12 | 99.3 | 100.2 | 100.4 | 99.6 |
| Example 13 | 100.9 | 100.7 | 100.4 | 100.7 |
| Example 14 | 100.4 | 100.9 | 99.8 | 100.2 |
| Example 15 | 98.9 | 100.0 | 98.7 | 99.2 |
| Comp. Ex. 1 | 100.0 | 100.0 | 100.0 | 100.0 |
| Comp. Ex. 2 | 99.1 | 100.2 | 99.7 | 99.8 |
| Comp. Ex. 3 | 10.1 | 75.6 | 35.0 | 6.2 |
| Comp. Ex. 4 | 25.1 | 82.1 | 53.3 | 23.5 |
| Comp. Ex. 5 | — | — | — | — |

The performances of the photovoltaic cell elements 1 to 15 were almost equivalent to the measured values of Comparative Example 1 or better than the measured values of Comparative Example 1. In particular, photovoltaic cell elements 4 and 5, in which the height of the electrode was increased in order to increase the aspect ratio, exhibited high power generation properties.

With the light-receiving electrodes of photovoltaic cell elements 1, 6 and 10, X-ray diffraction measurement was carried out with CuKα ray. As a result, diffraction peaks characteristic to copper were observed at least at 43.4°, 50.6° and 74.2°. The reason why copper was detected at the light-receiving surface electrode is presumed as follows.

The phosphorus-containing copper alloy particles used in the compositions for an electrode 1, 6 and 10 includes 6 mass % to 8 mass % of phosphorus. The composition of this portion is composed of an α-Cu phase and a $Cu_3P$ phase from the Cu—P phase diagram. In an early stage of sintering, the α-Cu phase is oxidized to turn to $Cu_2O$. It is also considered that the $Cu_2O$ is again reduced to turn to α-Cu. Further, it is considered that the phosphorus derived from the $Cu_3P$ phase or an oxide thereof, included in the phosphorus-containing copper alloy particles, contributes to the reduction reaction.

Accordingly, it is considered that oxidation of copper during sintering was suppressed and an electrode having a low resistivity was formed in Examples 1 to 15, in which phosphorus-containing copper alloy particles including 6 mass % to 8 mass % of phosphorus were used in the composition for an electrode, even though the retention time at the highest temperature was 10 seconds to 15 seconds. In addition, by increasing the sintering time, sintering of the phosphorus- Example 16

A photovoltaic cell element 16 having a structure as shown in FIG. 5 and FIG. 6 was prepared with the composition for an electrode 1. The heat treatment was performed at 850° C. for 10 seconds. The aspect ratio of the finger electrode was 10:1 and the aspect ratio of the bus bar electrode was 100:0, respectively.

Evaluation of the obtained photovoltaic cell element was carried out in a similar manner to the above. It was proved that the photovoltaic cell element also exhibited favorable performances.

This application claims priority under 35 USC 119 from Japanese Patent Application No. 2011-162599 filed Jul. 25, 2011, the disclosure of which is incorporated by reference herein.

All publications, patent applications, and technical standards mentioned in this specification are herein incorporated by reference to the same extent as if each individual publication, patent application, or technical standard was specifically and individually indicated to be incorporated by reference.

What is claimed is:
1. An element comprising a semiconductor substrate and an electrode disposed on the semiconductor substrate, the electrode being a sintered product of a composition for an electrode that comprises phosphorus-containing copper alloy particles, glass particles and a dispersing medium, and the electrode comprising a line-shaped electrode having an aspect ratio, which is defined as electrode short length:electrode height, of from 2:1 to 250:1, and wherein the content of phosphorus in the phosphorus-containing copper alloy particles is from 6 mass % to 8 mass %.

2. The element according to claim 1, wherein the glass particles have a glass softening point of 600° C. or less and a crystallization onset temperature of more than 600° C.

3. The element according to claim 1, wherein the composition for an electrode further comprises silver particles.

4. The element according to claim 3, wherein the content of the silver particles is from 5 mass % to 65 mass % when the total content of the phosphorous-containing copper alloy particles and the silver particles is 100 mass %.

5. The element according to claim 3, wherein the total content of the phosphorus-containing copper alloy particles and the silver particles in the composition for an electrode is from 70 mass % to 94 mass %, the content of the glass particles in the composition for an electrode is from 0.1 mass % to 10 mass %, and the content of the dispersing medium in the composition for an electrode is from 2 mass % to 29.9 mass %.

6. The element according to claim 1, wherein the semiconductor substrate comprises an impurity diffusion layer and the electrode is disposed on the impurity diffusion layer, and wherein the element is incorporated in a photovoltaic cell.

7. The element according to claim 1, wherein the semiconductor substrate comprises an impurity diffusion layer and the electrode is disposed on the impurity diffusion layer, and wherein the element is incorporated in a photovoltaic cell and a tab line is disposed on the electrode of the element.

8. The element according to claim 1, wherein the aspect ratio defined as electrode short length:electrode height is from 2.5:1 to 230:1.

9. The element according to claim 1, wherein the aspect ratio defined as electrode short length:electrode height is from 3:1 to 200:1.

10. The element according to claim 1, wherein the aspect ratio defined as electrode short length:electrode height is from 3:1 to 180:1.

11. The element according to claim 1, wherein the aspect ratio defined as electrode short length:electrode height is from 3:1 to 150:1.

12. The element according to claim 1, wherein a proportion of an area of the electrode having the aspect ratio defined as electrode short length:electrode height of from 2:1 to 250:1 with respect to the total area of the electrode, when observed from a thickness direction of the semiconductor substrate, is from 90% to 100%.

13. The element according to claim 1, wherein the short length of the electrode having an aspect ratio of from 2:1 to 250:1 is from 30 μm to 2000 μm.

14. The element according to claim 1, wherein the electrode is a sintered product of the composition for an electrode that comprises phosphorus-containing copper alloy particles, glass particles and a dispersing medium obtained by carrying out sintering in the presence of oxygen.

15. The element according to claim 1, wherein the electrode is a sintered product of the composition for an electrode that comprises phosphorus-containing copper alloy particles, glass particles and a dispersing medium obtained by carrying out sintering in the atmosphere.

* * * * *